United States Patent Office 3,050,389

Patented Aug. 21, 1962

3,050,389

LIGHT-SENSITIVE MATERIAL FOR THE PHOTO-MECHANICAL PREPARATION OF PRINTING PLATES

Oskar Süs, Wiesbaden-Biebrich, Germany, assignor, by mesne assignments, to Azoplate Corporation, Murray Hill, N.J., a corporation of New Jersey No Drawing. Filed July 28, 1958, Ser. No. 751,114
Claims priority, application Germany Aug. 3, 1957
26 Claims. (Cl. 96—33)

This invention relates to novel presensitized printing plates, and to a method for the preparation thereof and, more particularly, to presensitized printing plates the light-sensitive coatings of which comprise a quinone-(1,2)-diazide-sulfonic acid, esterified with a 2-hydroxyaryl-aryl-imidazole.

It is known to the art to prepare printing plates from flexible, usually foil-type supports, having a light-sensitive coating thereon, which is exposed to light under a master containing the image to be duplicated, and then converted into the actual printing plate by so-called development, to a positive or negative reproduction of the image. The light-sensitive coatings can be prepared with or without colloids, such as synthetic resins and the like.

Of the printing plates containing colloid-free light-sensitive coatings, those prepared from a certain class of diazo compounds are of special practical interest, i.e. those diazo compounds prepared from the sulfonic acid esters of ortho-quinone diazides, particularly those of the benzene or naphthalene series. If the quinone-(1,2)-diazide sulfonic acid esters used to form the light-sensitive coatings contain additional basic groups in the molecule, e.g. a methyl group substituted by a basic radical, or an imidazole ring, the coating, when exposed to light under a positive master, can be developed by means of an acid developer in such a manner that a negative printing image of the master is produced. The ortho-quinone diazide sulfonic acid esters, having basic groups in the molecule, previously used had a tendency to crystallize, which complicated the production of a thin uniform coating on the surface of the support.

In accordance with the present invention, it has been found that presensitized printing plates of excellent quality may be prepared wherein the light-sensitive coating comprises benzoquinone-(1,2)-diazide-sulfonic acids or naphthoquinone-(1,2)-diazide sulfonic acids, esterified with 2-hydroxyaryl-benzimidazoles, or 2-hydroxyaryl-naphtho-imidazoles in which the hydrogen atom attached to the nitrogen of the imidazole ring is replaced by another substituent. The esters which may be used in accordance with the present invention are those having the formula

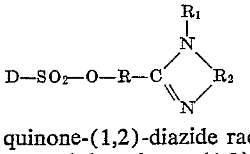

in which D is a quinone-(1,2)-diazide radical, preferably a benzoquinone or naphthoquinone-(1,2)-diazide radical, R and $R_2$ are substituted or unsubstituted arylene radicals, and $R_1$ may be alkyl, substituted alkyl, aralkyl, aryl, or a substituted aryl radical.

The presensitized printing plates produced according to the present invention, have coatings of the greatest possible uniformity of composition, and the conversion of which to printing plates consists of operations susceptible of good control. It is unnecessary to use mixtures of light-sensitive diazo compounds, or mixtures of diazo compounds with crystallization-inhibiting substances such as resins, because the diazo compounds corresponding to the general formula given above, have no tendency to form zones of crystallization, and the use of these diazo compounds results in coatings having very good storageability. However, the use of mixtures of several diazo compounds, or of diazo compounds with resins in the formation of light-sensitive coatings, is not precluded.

The diazo compounds employed are insoluble in water, but soluble in organic solvents; they have weakly basic properties which result from the presence of the imidazole ring in the molecule.

In the preparation of the light sensitive coatings, the diazo compounds are applied, in solution in an organic solvent, to a suitable support in any conventional manner, for example by whirl-coating, by direct application or by the immersion process. Solvents having reasonable volatility are preferred, i.e. those having a boiling point in the range of about 100 to 130° C. The support with the solution coated thereon is then dried at temperatures which preferably should not exceed 100° C. It has also been found advantageous to pass a hot air current over the coated surface.

Among the supports which are suitable for use in the preparation of the presensitized printing plates of the invention are foils of paper or metal, preferably aluminum foils, the surface of which may have been roughened mechanically or by chemical treatment or may have been anodically oxidized.

Printing plates are obtained from the presensitized printing plate in accordance with any of the known photomechanical processes, for example a light sensitive aluminum foil is exposed to light under a transparent master, and the image formed is then treated with an acid developer, for example an aqueous solution of a mineral acid or an acid salt. Organic solvents, such as alcohols, or the higher boiling-point hydrocarbons, as well as colloids such as gum arabic, may be added to the acid developers, if desired.

Since the indene carboxylic acids formed on the light exposed parts of the foil (see O. Süs, "Liebigs Annalen der Chemie," vol. 556 (1944), page 64 et seq.) have more weakly basic properties than does the original diazo compound which remains unexposed to light in those areas protected by the covering lines of the master, the acid treatment removes only the latter, while the light decomposition product remains on the support; the light decomposition product is oleophilic, and therefore accepts greasy printing ink. Printing plates are obtained which are negatives of the master, i.e. negative printing plates from positive masters, and vice versa; these can be used in the ordinary printing machines used in duplicating practice. The developed printing plates have great resistance to mechanical wear and are therefore capable of long runs.

The diazo compounds of the invention are novel compositions of matter, and are produced by the reaction of equimolecular quantities of sulfonic acid chlorides of benzoquinone or naphthoquinone-(1,2)-diazides, and 2-hydroxyaryl-benzimidazoles or 2-hydroxyaryl-naphthoimidazoles which are reacted in a suitable organic solvent in the presence of a basic compound, such as sodium carbonate.

In the preparation of the new diazo compounds, the reactants are dissolved in an organic solvent, such as dioxane, to which it may be desired to add dimethylformamide. The two solutions are then mixed and an acid-binding agent, for example dilute aqueous sodium carbonate solution, is slowly added to the mixture, while stirring, over a period of two or three hours, the reaction temperature being maintained between 20 and 30° C. The quinone-(1,2)-diazide-sulfonic acid esters produced can be purified by recrystallization from organic solvents, or by solution and reprecipitation, for example, by dissolving in dilute hydrochloric acid and precipitation with sodium bicarbonate solution. The esters are yellow in color and melt with decomposition, some of them having indefinite melting points.
Among the new diazo compounds contemplated by the present invention are those having the following formulae:
Formula 1
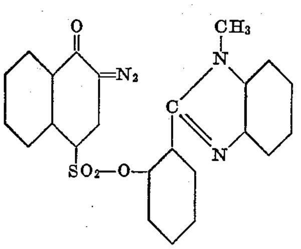
Formula 2
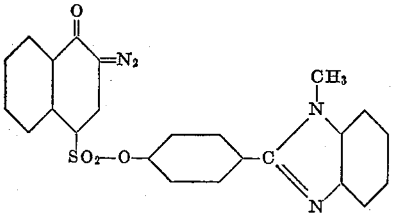
Formula 3
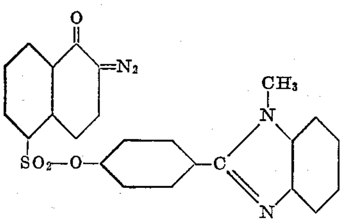
Formula 4
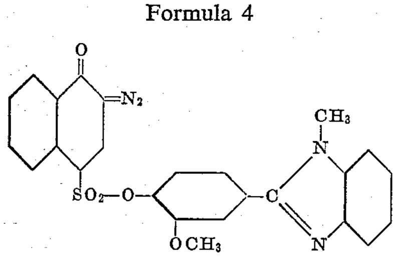
Formula 5
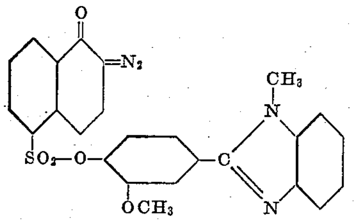
Formula 6
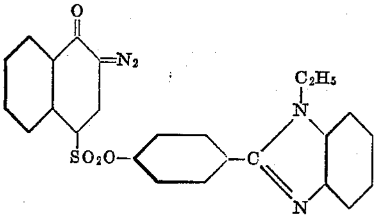
Formula 7
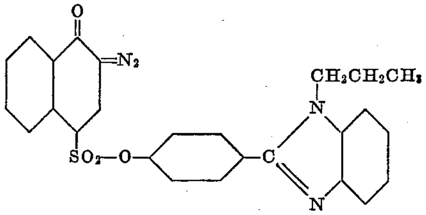
Formula 8
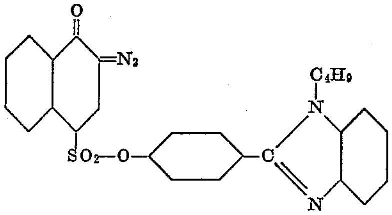
Formula 9
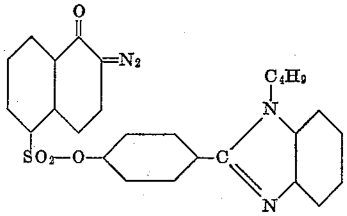
Formula 10
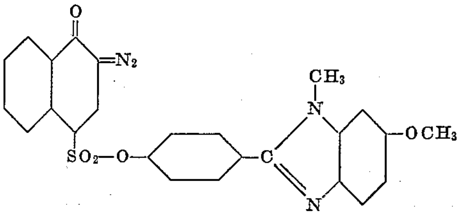
Formula 11
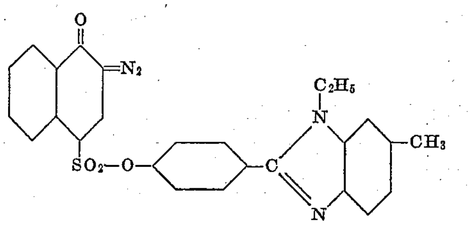
Formula 12
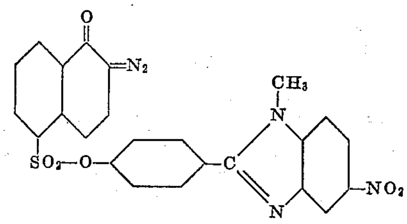
Formula 13
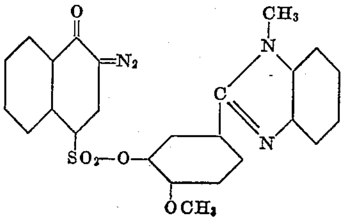

Formula 14
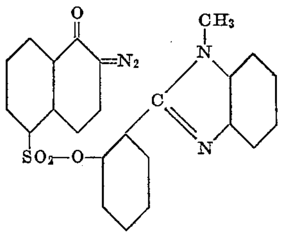
Formula 15
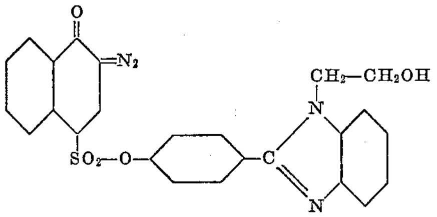
Formula 16
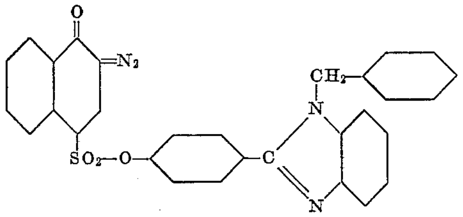
Formula 17
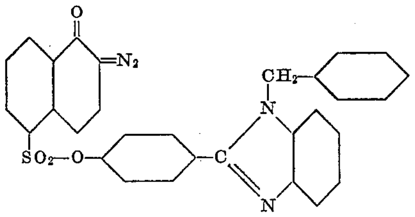
Formula 18
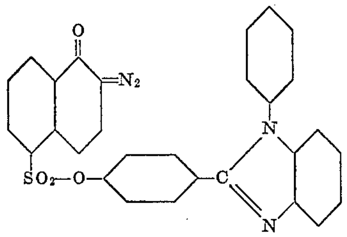
Formula 19
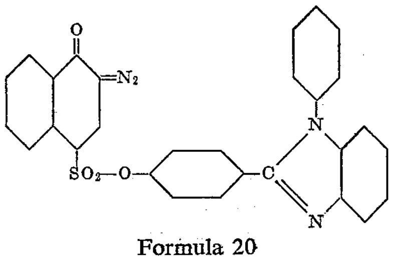
Formula 20
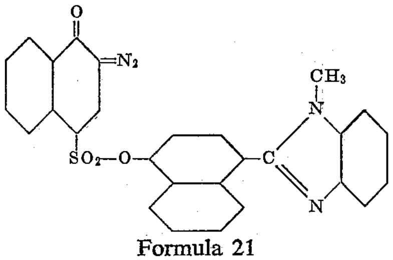
Formula 21
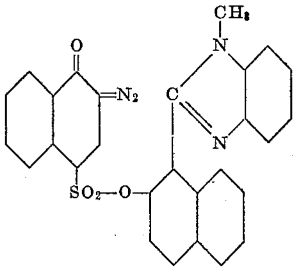
Formula 22
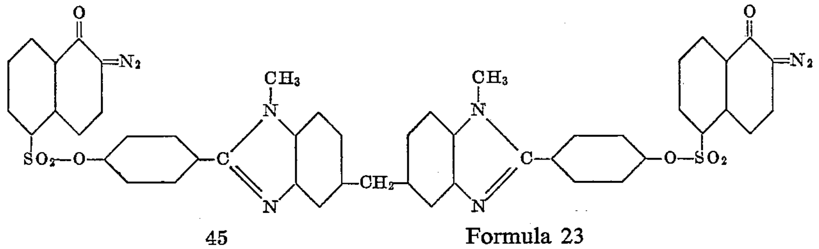
Formula 23
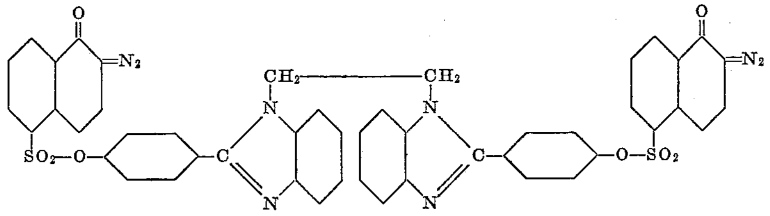
Formula 24
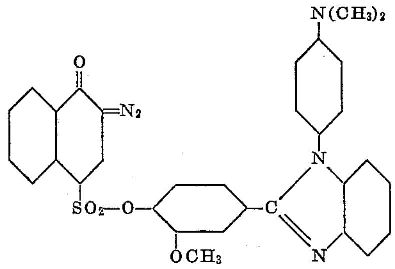
Formula 25
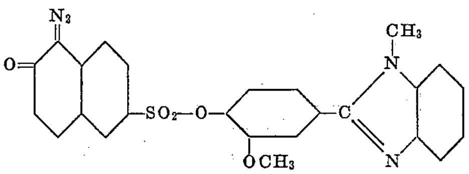

Formula 26
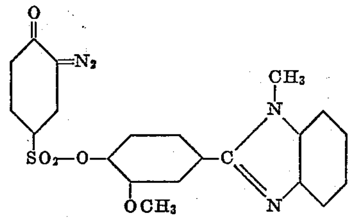
Formula 27
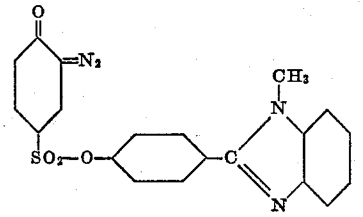
Formula 28
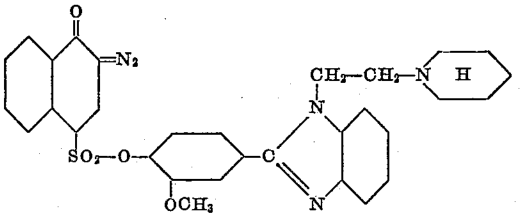
Formula 29
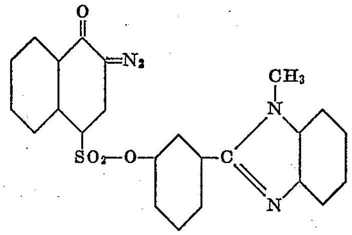
Formula 30
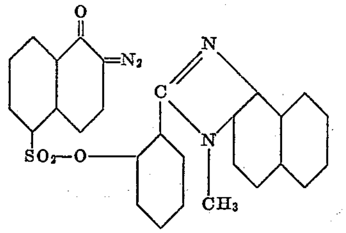
Formula 31
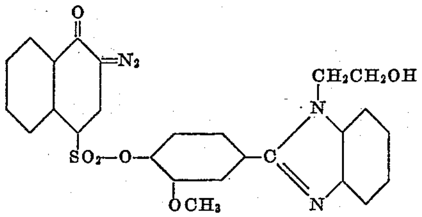
Formula 32
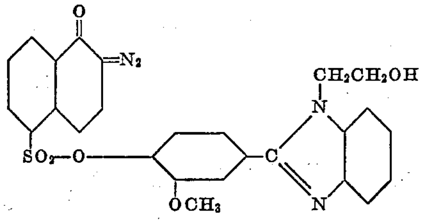
Formula 33
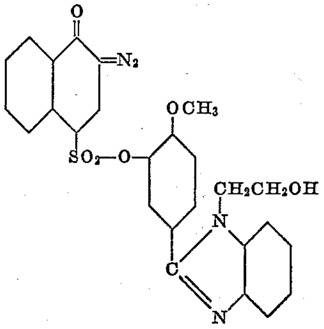
Formula 34
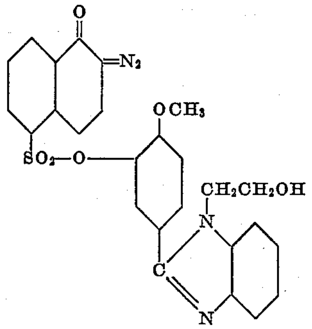
Formula 35
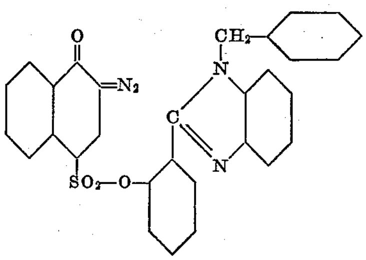
Formula 36
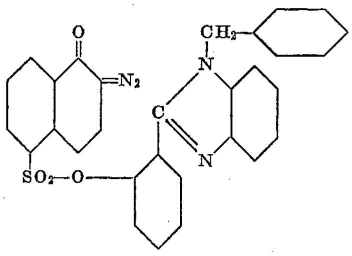
Formula 37
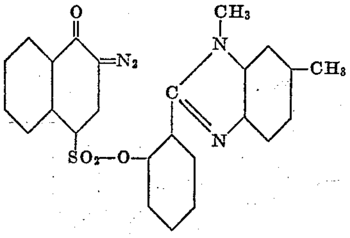
Formula 38
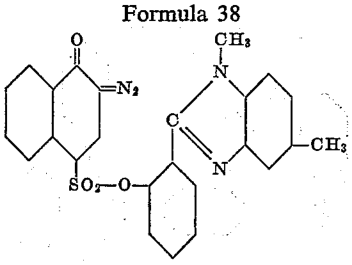

Formula 39
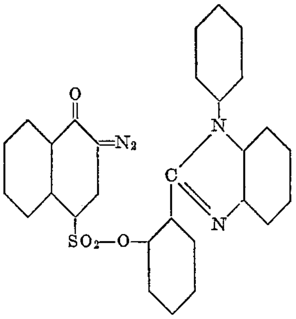
Formula 40
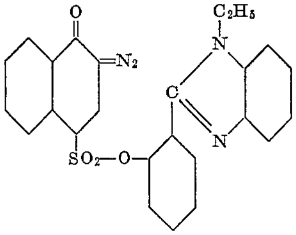
Formula 41
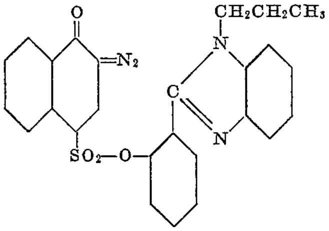
Formula 42
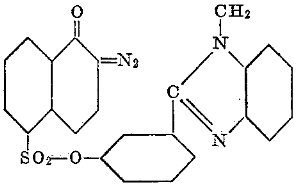
Formula 43
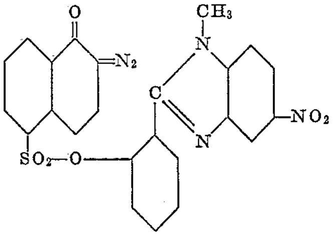
Formula 44
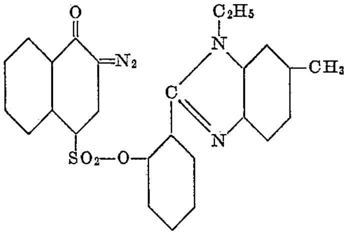
Formula 45
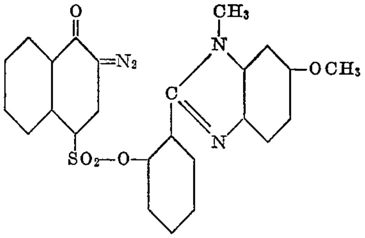
Formula 46
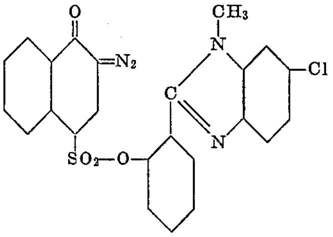
Formula 47
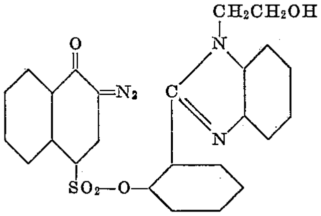
Formula 48
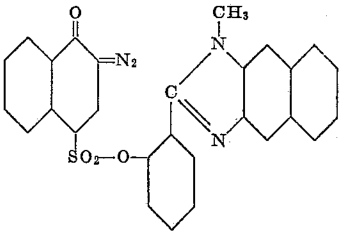
Formula 49
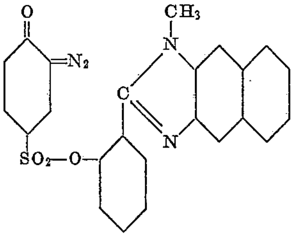
Formula 50
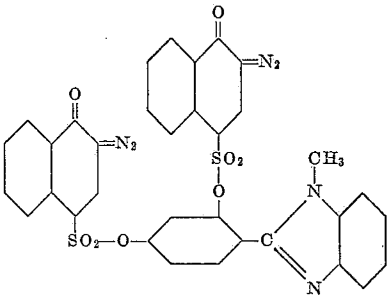

Formula 51

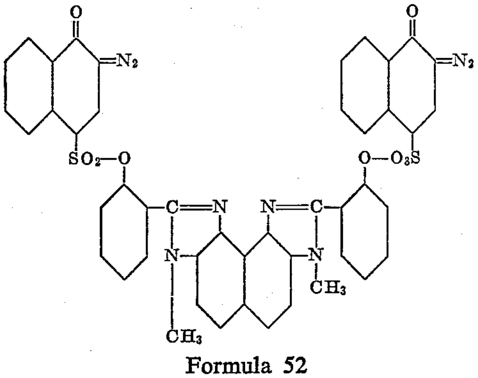

Formula 52

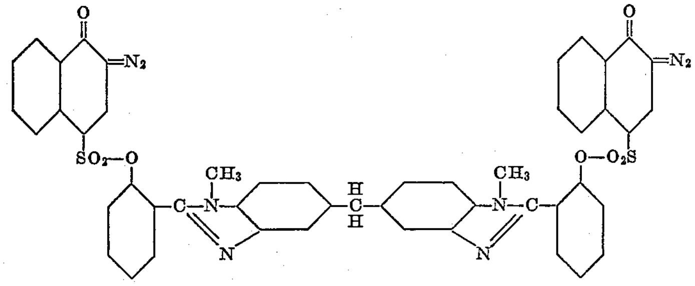

In Table I below, are listed the reaction components from which the compounds having the formulae given above can be prepared, in accordance with the previously described procedure:

TABLE I

| Formula No. of compound | Quinone-(1,2)-diazide-sulfonic acid chloride | 2-hydroxyaryl-benzimidazole or 2-hydroxyaryl-naphthoimidazole from Table II | Melting point with decomposition, ° C. |
|---|---|---|---|
| 1 | Naphthoquinone-(1,2)-diazide-(2)-4-sulphochloride, 6 parts by weight | I—4.5 parts by weight | 142–144 |
| 2 | Naphthoquinone-(1,2)-diazide-(2)-4-sulphochloride, 1.5 parts by wieght | II—1.1 parts by weight | 175–176 |
| 3 | Naphthoquinone-(1,2)-diazide-(2)-5-sulphochloride, 0.8 part by weight | II—0.6 part by weight | 105–108 |
| 4 | Naphthoquinone-(1,2)-diazide-(2)-4-sulphochloride, 3 parts by weight | III—2.54 parts by weight | 157–162 |
| 5 | Naphthoquinone-(1,2)-diazide-(2)-5-sulphochloride, 1.5 parts by weight | III—1.27 parts by weight | 134–136 |
| 6 | Naphthoquinone-(1,2)-diazide-(2)-4-sulphochloride, 1.5 parts by weight | IV—1.2 parts by weight | 165–167 |
| 7 | Naphthoquinone-(1,2)-diazide-(2)-4-sulphochloride, 3 parts by weight | V—2.5 parts by weight | 170–172 |
| 8 | do | VI—2.7 parts by weight | 132–134 |
| 9 | Napthoquinone-(1,2)-diazide-(2)-5-sulphochloride, 3 parts by weight | do | 163–165 |
| 10 | Naphthoquinone-(1,2)-diazide-(2)-4-sulphochloride, 3 parts by weight | VII—2.5 parts by weight | 135–140 |
| 11 | do | VIII—2.5 parts by weight | 184–185 |
| 12 | Naphthoquinone-(1,2)-diazide-(2)-5-sulphochloride, 3 parts by wieght | IX—2.7 parts by weight | 133–135 |
| 13 | Naphthoquinone-(1,2)-diazide-(2)-4-sulphochloride, 3 parts by weight | X—2.5 parts by weight | 215–220 |
| 14 | Naphthoquinone-(1,2)-diazide-(2)-5-sulphochloride, 0.8 part by weight | I—0.5 part by weight | 143–145 |
| 15 | Naphthoquinone-(1,2)-diazide-(2)-4-sulphochloride, 1.9 parts by weight | XI—1.65 parts by weight | 165–167 |
| 16 | Naphthoquinone-(1,2)-diazide-(2)-4-sulphochloride, 3 parts by weight | XII—3 parts by weight | 175–180 |
| 17 | Naphthoquinone-(1,2)-diazide-(2)-5-sulphochloride, 3 parts by weight | do | 178–180 |
| 18 | do | XIII—3 parts by weight | 97 |
| 19 | Naphthoquinone-(1,2)-diazide-(2)-4-sulphochloride, 3 parts by weight | do | [1] 90–110 |
| 20 | Naphthoquinone-(1,2)-diazide-(2)-4-sulphochloride, 1.8 parts by weight | XIV—1.4 parts by weight | [2] 120 |
| 21 | Naphthoquinone-(1,2)-diazide-(2)-4-sulphochloride, 0.6 part by weight | XV—0.6 part by weight | 119–120 |
| 22 | Naphthoquinone-(1,2)-diazide-(2)-5-sulphochloride, 1.3 parts by weight | XVI—0.9 part by weight | [2]150 |
| 23 | Naphthoquinone-(1,2)-diazide-(2)-5-sulphochloride,3 parts by weight | XVII—2.23 parts by weight | 225–230 |
| 24 | Naphthoquinone-(1,2)-diazide-(2)-4-sulphochloride, 2.3 parts by weight | XIX—2.7 parts by weight | 140–142 |
| 25 | Naphthoquinone-(1,2)-diazide-(1)-6-sulphochloride, 2.7 parts by weight | III—2 parts by weight | 128–130 |
| 26 | Benzoquinone-(1,2)-diazide-(2)-4-sulphochloride, 2.2 parts by weight | III—2.5 parts by weight | 115–119 |
| 27 | Benzoquinone-(1,2)-diazide-(2)-4-sulphochloride, 2.3 parts by weight | II—2.2 parts by weight | 80–84 |
| 28 | Naphthoquinone-(1,2)-diazide-(2)-4-sulphochloride, 3 parts by weight | XVIII—3.5 parts by weight | 110–115 |
| 29 | do | XX—2.25 parts by weight | 160–165 |
| 30 | Naphthoquinone-(1,2)-diazide-(2)-5-sulphochloride, 3 parts by weight | XXI—2.7 parts by weight | 175–178 |
| 31 | Naphthoquinone-(1,2)-diazide-(2)-4-sulphochloride, 3 parts by weight | XXII—3.2 parts by weight | 169–170 |
| 32 | Naphthoquinone-(1,2)-diazide-(2)-5-sulphochloride, 3 parts by weight | do | 137–138 |
| 33 | Naphthoquinone-(1,2)-diazide-(2)-4-sulphochloride, 3 parts by weight | XXIII—3.2 parts by weight | [2]170 |
| 34 | Naphthoquinone-(1,2)-diazide-(2)-5-sulphochloride, 3 parts by weight | do | 162–164 |
| 35 | Naphthoquinone-(1,2)-diazide-(2)-4-sulphochloride, 3 parts by weight | XXIV—3 parts by weight | 148–150 |
| 36 | Naphthoquinone-(1,2)-diazide-(2)-5-sulphochloride, 3 parts by weight | do | 149–150 |
| 37 | Naphthoquinone-(1,2)-diazide-(2)-4-sulphochloride, 3 parts by weight | XXV—2.4 parts by weight | 115–116 |
| 38 | do | XXVI—2.4 parts by weight | 176–178 |
| 39 | Naphthoquinone-(1,2)-diazide-(2)-4-sulphochloride, 2 parts by weight | XXVII—1.9 parts by weight | 174 |
| 40 | Naphthoquinone-(1,2)-diazide-(2)-4-sulphochloride, 3 parts by weight | XXVIII—2.4 parts by weight | 146–148 |
| 41 | do | XXIX—2.5 parts by weight | 114–116 |
| 42 | Naphthoquinone-(1,2)-diazide-(2)-5-sulphochloride, 3 parts by weight | XXX—2.25 parts by weight | 170 |
| 43 | do | XXXI—2.7 parts by weight | 203–205 |
| 44 | Naphthoquinone-(1,2)-diazide-(2)-4-sulphochloride, 3 parts by weight | XXXII—2.5 parts by weight | 112–115 |
| 45 | do | XXXIII—2.5 parts by weight | 170–171 |
| 46 | do | XXXIV—2.6 parts by weight | 126–128 |
| 47 | Naphthoquinone-(1,2)-diazide-(2)-4-sulphochloride, 1.65 parts by weight | XXXV—1.45 parts by weight | 153–154 |
| 48 | Naphthoquinone-(1,2)-diazide-(2)-4-sulphochloride, 3 parts by weight | XXXVI—2.7 parts by weight | 159–161 |
| 49 | Benzoquinone-(1,2)-diazide-(2)-4-sulphochloride, 2.3 parts by weight | do | [2]125–130 |
| 50 | Naphthoquinone-(1,2)-diazide-(2)-4-sulphochloride, 3 parts by weight | XXXVII—1.2 parts by weight | 170 |
| 51 | Naphthoquinone-(1,2)-diazide-(2)-4-sulphochloride, 1.5 parts by weight | XXXVIII—1.05 parts by weight | [2]150–155 |
| 52 | Naphthoquinone-(1,2)-diazide-(2)-4-sulphochloride, 3 parts by weight | XXXIX—2.3 parts by weight | [2]235–240 |

[1] Not sharp. [2] Not sharp c.

TABLE II

The hydroxyaryl-benzimidazoles and hydroxyaryl-naphthoimidazoles used in the esterification reaction are prepared in the manner described in "Liebigs Annalen der Chemie," vol. 575 (1952), pages 162–169, by the reaction of o-diamines of the benzene or naphthalene series, with aromatic hydroxyaldehydes in alcoholic solution, nitrobenzenes being used where necessary as dehydrogenating agents.

In the many cases where atmospheric oxygen is sufficient for ring closure with dehydrogenation, the addition of these dehydrogenating agents is unnecessary.

Compounds I to XXI given in Table II below, are obtained in this manner, for example:

The image obtained was developed by swabbing it with a 1 percent phosphoric acid solution. The plate could

TABLE II

| | 2-hydroxyaryl-benzimidazoles and 2-hydroxy-aryl-naphthimidazoles | Diamines | Aromatic hydroxy-aldehyde | Addition | Melting point, ° C. |
|---|---|---|---|---|---|
| I | 1-methyl-2-(2′-hydroxyphenyl)-benzimidazole | N-methyl-o-phenylene-diamine | 2-hydroxy-benzaldehyde | 1, 3-di-nitro-benzene. | 164-165 |
| II | 1-methyl-2-(4′-hydroxyphenyl)-benzimidazole | do | 4-hydroxy-benzaldehyde. | ---- | 283–285 |
| III | 1-methyl-2-(4′-hydroxy-3′-methoxy-phenyl) benzimidazole. | do | 4-hydroxy-3-methoxy-benzaldehyde. | Nitro-benzene | 203–205 |
| IV | 1-ethyl-2-(4′-hydroxyphenyl)-benzimidazole | N-ethyl-o-phenylene diamine | 4-hydroxy-benzaldehyde. | ---- | 242–245 |
| V | 1-propyl-2-(4′-hydroxyphenyl)-benzimidazole | N-propyl-o-phenylene diamine | do | ---- | 239–240 |
| VI | 1-butyl-2-(4′-hydroxyphenyl)-benzimidazole | N-butyl-o-phenylene-diamine | do | ---- | 168–170 |
| VII | 1-methyl-2-(4′-hydroxyphenyl)-6-methoxy-benzimidazole. | 4-amino-5-methylamino-anisole | do | ---- | 263–266 |
| VIII | 1-ethyl-2-(4′-hydroxyphenyl)-6-methyl-benzimidazole. | 4-amino-5-ethyl-amino toluene | do | ---- | 287–289 |
| IX | 1-methyl-2-(4′-hydroxyphenyl)-5-nitro-benzimidazele. | 1-nitro-3-amino-4-methyl-amino-benzene | do | ---- | 112–113 |
| X | 1-methyl 2-(3′-hydroxy-4′-methoxy-phenyl)-benzimidazole. | N-methyl-o-phenylene-diamine | 3-hydroxy-4-methoxy-benzaldehyde. | Nitrobenzene | 194–195 |
| XI | 1-$\beta$-hydroxy-ethyl-2-(4′-hydroxyphenyl)-benzimidazole. | N-$\beta$-hydroxyethyl-o-phenylene-diamine. | 4-hydroxy-benzaldehyde. | ---- | 196–198 |
| XII | 1-benzyl-2-(4′-hydroxyphenyl)-benzimidazole | N-benzyl-o-phenylene-diamine | do | Nitrobenzene | 232–234 |
| XIII | 1-phenyl-2-(4′-hydroxyphenyl)-benzimidazole | N-phenyl-o-phenylene-diamine | do | do | 280–281 |
| XIV | 1-methyl-2-(4′-hydroxy-naphthyl)-benzimidazole | N-methyl-o-phenylene-diamine | 4-hydroxy-naphthaldehyde. | ---- | 310–312 |
| XV | 1-methyl-2-(2′-hydroxynaphthyl)-benzimidazole | do | 2 hydroxy-naphthaldehyde. | Nitrobenzene | 288–290 |
| XVI | Bis-[1-methyl-2-(4′-hydroxyphenyl)-benzimidazolyl-(5)]-methane. | 3,3′-di-amino-4,4′-bis-methyl-aminodiphenyl-methane. | 4-hydroxy-benzalde hyde (2 mols). | ---- | 322–326 |
| XVII | Bis-[2-(4′-hydroxyphenyl)-benzimidazolyl-(1)]-$\alpha$, $\beta$-ethane. | N,N′-bis-(2-aminophenyl)-ethylene diamine. | do | Nitro-benzene. | 403–404 |
| XVIII | 1-$\beta$-piperidinoethyl-2-(4′-hydroxy-3′-methoxy-phenyl)-benzimidazole. | N-($\beta$-piperidinoethyl)-o-phenylene diamine. | 4-hydroxy-3-methoxy-benzaldehyde. | m-Dinitro-benzene. | 165–167 |
| XIX | 1-(4″-dimethyl-amino-phenyl)-2-(4′-hydroxy-3′-methoxy-phenyl)-benzimidazole. | 2-amino-4′-dimethyl-amino-diphenyl-amine. | do | Nitro-benzene. | 225–226 |
| XX | 1-methyl-2-(3′-hydroxyphenyl)-benzimidazole | N-methyl-o-phenylene-diamine | 3-hydroxy-benzaldehyde. | m-Dinitro-benzene. | 187 |
| XXI | 1-methyl-2-(2′-hydroxyphenyl)-[naphtho-1″,2″, 4,5-imidazole]. | N-methyl-naphthylene-diamine (1,2). | 2-hydroxy-benzaldehyde. | do | 157–158 |
| XXII | 1-$\beta$-hydroxy-ethyl-2-(4′-hydroxy-3′-methoxy-phenyl)-benzimidazole. | N-$\beta$-hydroxy-ethyl-o-phenylene-diamine. | 4-hydroxy-3-methoxy-benzaldehyde. | 1,3-dinitro-benzene. | [1]250–252 |
| XXIII | 1-$\beta$-hydroxy-ethyl-2-(3′-hydroxy-4′-methoxy-phenyl)-benzimidazole. | do | 3-hydroxy-4-methoxy-benzaldehyde. | do | [1]219–220 |
| XXIV | 1-benzyl-2-(2′-hydroxyphenyl)-benzimidazole | N-benzyl-o-phenylene-diamine | 2-hydroxy-benzaldehyde. | do | 177–178 |
| XXV | 1-methyl-2-(2′-hydroxyphenyl)-6-methyl-benzimidazole. | 4-amino-5-methyl-amino-toluene. | do | do | 144 |
| XXVI | 1-methyl-2-(2′-hydroxyphenyl)-5-methyl-benzimidazole. | 3-amino-4-methyl-amino-toluene. | do | do | 184–185 |
| XXVII | 1-phenyl-2-(2′-hydroxyphenyl)-benzimidazole | N-phenyl-o-phenylene-diamine | do | do | 106–107 |
| XXVIII | 1-ethyl-2-(2′-hydroxyphenyl)-benzimidazole | N-ethyl-o-phenylene-diamine | do | do | 129 |
| XXIX | 1-propyl-2-(2′-hydroxyphenyl)-benzimidazole | N-propyl-o-phenylene-diamine | do | do | 130–131 |
| XXX | 1-methyl-2-(3′-hydroxyphenyl)-benzimidazole | N-methyl-o-phenylenediamine | 3-hydroxy-benzaldehyde. | ---- | 187 |
| XXXI | 1-methyl-2-(2′-hydroxyphenyl)-5-nitro-benzimidazole. | N-nitro-3-amino-4-methylamino-benzene. | 2-hydroxy-benzaldehyde. | 1,3-dinitro-benzene. | 182–185 |
| XXXII | 1-ethyl-2-(2′-hydroxyphenyl)-6-methyl-benzimidazole. | 4-amino-5-ethylamino-toluene | do | do | 133–136 |
| XXXIII | 1-methyl-2-(2′-hydroxyphenyl)-6-methoxy-benzimidazole. | 4-amino-5-methylamino-anisole | do | do | 153–154 |
| XXXIV | 1-methyl-2-(2′-hydroxyphenyl)-6-chloro-benzimidazole. | 4-amino-5-methylamino-1-chloro-benzene. | do | do | 139–141 |
| XXXV | 1-$\beta$-hydroxy-ethyl-2-(2′-hydroxyphenyl)-benzimidazole. | N-$\beta$-hydroxy-ethyl-o-phenylene diamine. | do | do | 157–158 |
| XXXVI | 1-methyl-2-(2′-hydroxyphenyl)-[naphtho-2″,3″, 45-imidazole] | N-methyl-naphthylene-diamine -(2,3). | do | do | 155–156 |
| XXXVII | 1-methyl-2-(2′,4′-di-hydroxyphenyl)-benzimidazole. | N-methyl-o-phenylene-di-amine | 2,4-dihydroxy-benzaldehyde. | do | [2]122–138 |
| XXXVIII | Bis-[1-methyl-2-(2′-hydroxyphenyl)]-naphtho-1, 2,7,8-imidazole. | 1,8-diamino-2,7-di-(methyl-amino)-naphthalene. | 2-hydroxy-benzaldehyde. | ---- | 330–335 |
| XXXIX | Bis-[1-methyl-2-(2′-hydroxyphenyl)-benzimidazolyl-(5)]-methane. | 3,3′-diamino-4,4′-bis-methyl-amino-diphenyl-methane. | 2-hydroxy-benzaldehyde (2 mols). | 1,3-dinitro-benzene. | 264 |

[1] Hydrochloride. [2] Not sharp.

The invention will be further illustrated by the following specific examples:

*Example 1*

An aluminum foil, brushed on one side, was whirl-coated on the brushed side with a solution of 1 part by weight of the diazo compound corresponding to Formula 1 above, in 100 parts by volume of glycolmonomethylether. The coating was dried in a hot air current and the foil was then further dried for a period of two minutes at a temperature of 100° C., to insure complete removal of the solvent. The dried coating was then exposed to light under a film negative, i.e. to an 18 amp. arc lamp, at a distance of 70 cm. for a period of about one minute. The image obtained was developed by swabbing it with a 1 percent phosphoric acid solution. The plate could then be inked up immediately with greasy ink, either by hand or using a conventional printing apparatus, and used for printing. From a negative master, a positive printing plate is obtained, from which several thousand prints can be made. It may be desirable in some cases to add a thickening agent, such as gum arabic or dextrin, to the phosphoric acid developing solution.

Equally good results were obtained using, instead of the sulphonic acid ester corresponding to Formula 1 above, the diazo compound corresponding to those listed in Table I. Slight changes in coating procedure and developing solutions will be obvious to those skilled in the art, but in the following table certain differences are listed.

TABLE III

| Formula No. to which compound corresponds | Solvent for the diazo compound | Developer solution |
|---|---|---|
| 3 | Glycolmonomethylether pyridine (3:1). | 5% phosphoric acid solution. |
| 4 | As in Example 1 | Do. |
| 5 | do | Do. |
| 6 | do | 5–10% phosphoric acid solution. |
| 8 | do | 10% phosphoric acid solution. |
| 9 | do | 5% phosphoric acid solution. |
| 10 | do | 10% phosphoric acid solution. |
| 12 | do | 80% ethylalcohol solution with 5% of phosphoric acid. |
| 13 | Glycolmonomethylether dimethylformamide (1:1). | As in Example 1. |
| 15 | As in Example 1 | 1–5% phosphoric acid solution. |
| 16 | do | 60–80% ethylalcohol solution with 2.5% of phosphoric acid. |
| 17 | do | 10% phosphoric acid solution. |
| 18 | do | 50% ethylalcohol solution with 2.5% of phosphoric acid. |
| 19 | do | 5% phosphoric acid solution. |
| 20 | do | 40% propylalcohol solution with 2.5% of phosphoric acid. |
| 21 | do | 5% phosphoric acid solution. |
| 22 | do | 80% ethylalcohol solution with 5% of phosphoric acid. |
| 23 | do | 40% ethylalcohol solution with 2.5% of phosphoric acid. |
| 28 | do | 20% monosodium phosphate solution. |
| 29 | do | 5% sulphuric acid solution. |
| 30 | do | As in Example 1. |

*Example 2*

A paper foil prepared in accordance with the disclosure of U.S. Patent No. 2,534,588, was coated on the coating side with a 1.5 percent by weight solution of the compound of Formula 14 above, in glycolmonomethylether, and was dried for about 2 minutes at a temperature of about 90 to 100° C. The light-sensitive foil was then exposed to light beneath a negative film master, and developed with a 0.5 percent by weight phosphoric acid solution. When the developed coating was inked up with greasy ink, a positive printing plate was obtained.

*Example 3*

Following the general procedure of Example 1 above, an anodically oxidized aluminum foil was coated with a solution of one part by weight of the diazo compound of Formula 15 in 100 parts by volume of glycolmonomethylether, dried, and exposed to light under a master. The plate was developed by swabbing with a 1–5 percent by weight phosphoric acid solution. A positive printing plate was obtained from the negative master.

*Example 4*

Following the general procedure of Example 1 above, a 1 percent by weight solution of the compound of Formula 16 in glycolmonomethylether was applied to an aluminum foil, mechanically brushed on one side and then dried. The light-sensitive foil was exposed to light under a transparent master, and developed by treatment with a 60–80 percent solution of ethylalcohol, containing 2.5 percent by weight of phosphoric acid. A positive printing plate was obtained from the negative master.

Equally good results were achieved using the compounds corresponding to Formulae 2 to 23 above. For the development of the image to a completed printing plate, slight variations in the developer solutions are necessary for the individual diazo compounds; note the data given in Example 1 above.

*Example 5*

Following the general procedure of Example 1 above, a light-sensitive aluminum foil was coated with the diazo compound of Formula 24, and made into a printing plate in the conventional fashion. For the development of the image, a 10 percent phosphoric acid solution was used. When the developed coating was inked up with greasy ink, a positive printing plate was obtained, as the result of the use of a negative master.

*Example 6*

1.5 parts by weight of the compound of Formula 25 were dissolved in 100 parts by volume of glycolmonomethylether, and an aluminum foil was coated with this solution, as described in Example 1 above, and then dried. After exposure and development with a 0.5–1 percent by weight phosphoric acid solution, a positive printing plate was obtained from a negative master, which could be used for printing after being inked up with greasy ink.

*Example 7*

An aluminum foil roughened on one side by brushing, was coated with a 1.5 percent solution of the compound of Formula 26 in glycolmonomethylether, and then dried. The foil was then exposed to light under a transparent master, developed with a 5 percent phosphoric acid solution, and the image was then inked up with greasy ink. A positive printing plate was obtained from the negative master.

It will be obvious to those skilled in the art that many modifications may be made within the scope of the present invention without departing from the spirit thereof, and the invention includes all such modifications.

What is claimed is:

1. A compound having the formula

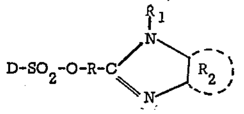

in which D is a quinone-(1,2)-diazide radical, R and $R_2$ are arylene groups, and $R_1$ is selected from the group consisting of alkyl, and aralkyl and aryl groups.

2. A compound having the formula

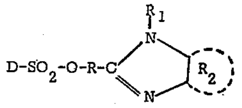

in which D is a quinone-(1,2)-diazide radical, R and $R_2$ are arylene groups, and $R_1$ is an alkyl group.

3. A compound having the formula

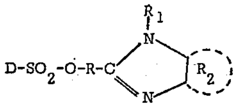

in which D is a quinone-(1,2)-diazide radical, R is an arylene group, $R_1$ is an aralkyl group, and $R_2$ is an arylene group.

4. A compound having the formula

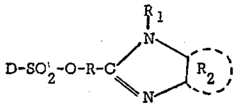

in which D is a quinone-(1,2)-diazide radical, R and $R_2$ are arylene groups, and $R_1$ is an aryl group.

5. A presensitized printing plate comprising a base material having a coating thereon comprising a compound having the formula

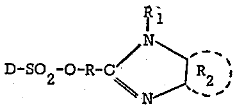

in which D is a quinone-(1,2)-diazide radical, R and $R_2$ are arylene groups, and $R_1$ is selected from the group consisting of alkyl, aralkyl and aryl groups.

6. A presensitized printing plate comprising a base material having a coating thereon comprising a compound having the formula

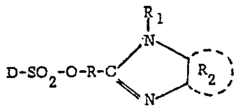

in which D is a quinone-(1,2)-diazide radical, R and $R_2$ are arylene groups, and $R_1$ is an alkyl group.

7. A presensitized printing plate comprising a base material having a coating thereon comprising a compound having the formula

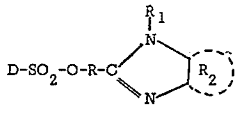

in which D is a quinone-(1,2)-diazide radical, R is an arylene group, $R_1$ is an aralkyl group, and $R_2$ is an arylene group.

8. A presensitized printing plate comprising a base material having a coating thereon comprising a compound having the formula

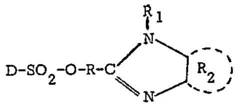

in which D is a quinone-(1,2)-diazide radical, R and $R_2$ are arylene groups, and $R_1$ is an aryl group.

9. A method of developing a presensitized printing plate which comprises exposing to light under a master a base material having a coating thereon comprising a compound having the formula

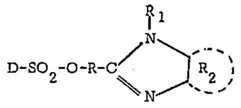

in which D is a quinone-(1,2)-diazide radical, R and $R_2$ are arylene groups, and $R_1$ is selected from the group consisting of alkyl, aralkyl and aryl groups, and treating the light-exposed coating with an acidic developer.

10. A method of developing a presensitized printing plate which comprises exposing to light under a master a base material having a coating thereon comprising a compound having the formula

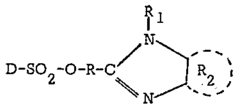

in which D is a quinone-(1,2)-diazide radical, R and $R_2$ are arylene groups, and $R_1$ is an alkyl group, and treating the light-exposed coating with an acidic developer.

11. A method of developing a presensitized printing plate which comprises exposing to light under a master a base material having a coating thereon comprising a compound having the formula

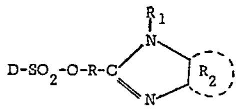

in which D is a quinone-(1,2)-diazide radical, R is an arylene group, $R_1$ is an aralkyl group, and $R_2$ is an arylene group, and treating the light-exposed coating with an acidic developer.

12. A method of developing a presensitized printing plate which comprises exposing to light under a master a base material having a coating thereon comprising a compound having the formula

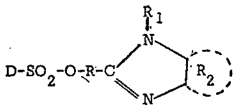

in which D is a quinone-(1,2)-diazide radical, R and $R_2$ are arylene groups, and $R_1$ is an aryl group, and treating the light-exposed coating with an acidic developer.

13. A method of developing a presensitized printing plate which comprises exposing to light under a master a base material having a coating thereon comprising a compound having the formula

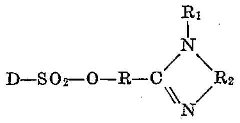

in which D is a quinone-(1,2)-diazide radical, R and $R_2$ are arylene groups, and $R_1$ is selected from the group consisting of alkyl, aralkyl and aryl groups, and treating the light-exposed coating with dilute phosphoric acid solution.

14. A method of developing a presensitized printing plate which comprises exposing to light under a master a base material having a coating thereon comprising a compound having the formula

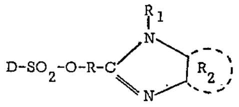

in which D is a quinone-(1,2)-diazide radical, R and $R_2$ are arylene groups, and $R_1$ is an alkyl group, and treating the light-exposed coating with dilute phosphoric acid solution.

15. A method of developing a presensitized printing plate which comprises exposing to light under a master a base material having a coating thereon comprising a compound having the formula

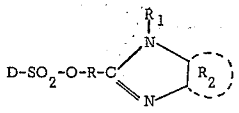

in which D is a quinone-(1,2)-diazide radical, R is an arylene group, $R_1$ is an aralkyl group, and $R_2$ is an arylene group, and treating the light-exposed coating with dilute phosphoric acid solution.

16. A method of developing a presensitized printing plate which comprises exposing to light under a master a base material having a coating thereon comprising a compound having the formula

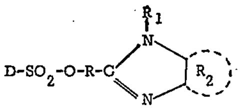

in which D is a quinone-(1,2)-diazide radical, R and $R_2$ are arylene groups, and $R_1$ is an aryl group, and treating the light-exposed coating with dilute phosphoric acid solution.

17. A compound having the formula

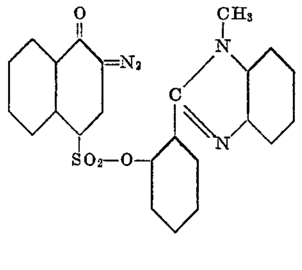

18. A compound having the formula

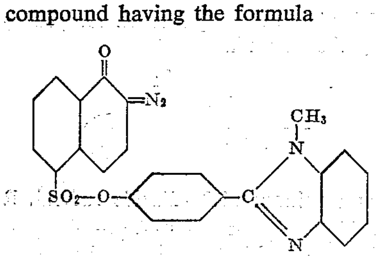

19. A compound having the formula

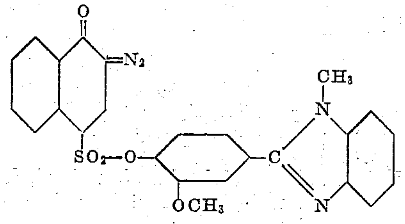

20 A compound having the formula

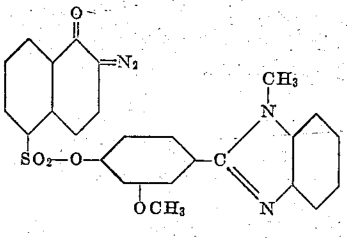

21. A compound having the formula

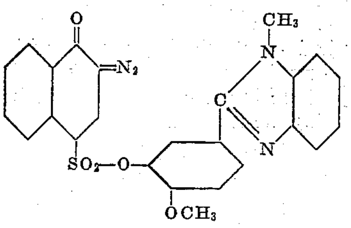

22. A compound having the formula

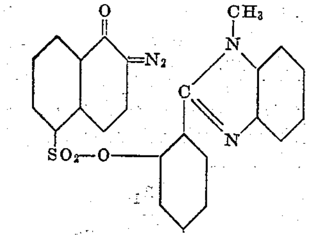

23. A compound having the formula

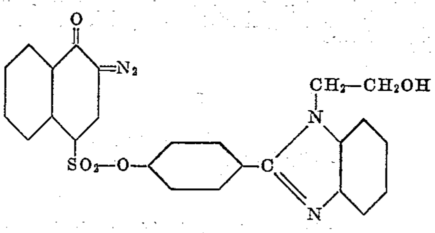

24. A compound having the formula

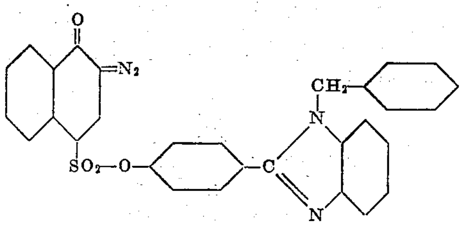

25. A compound having the formula

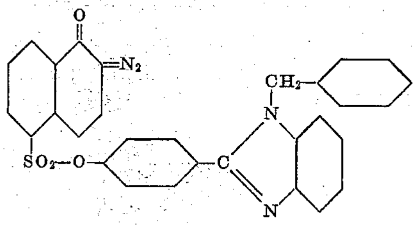

26. A compound having the formula

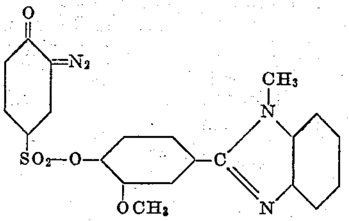

References Cited in the file of this patent

UNITED STATES PATENTS

| | | |
|---|---|---|
| 2,754,209 | Schmidt et al. | July 10, 1956 |
| 2,759,817 | Schmidt et al. | Aug. 21, 1956 |

FOREIGN PATENTS

| | | |
|---|---|---|
| 497,135 | Belgium | Nov. 16, 1950 |
| 497,206 | Belgium | Nov. 16, 1950 |
| 500,222 | Belgium | Jan. 15, 1951 |
| 928,621 | Germany | June 6, 1955 |
| 567,659 | Great Britain | Feb. 26, 1945 |

OTHER REFERENCES

Jerchel et al.: Liebigs Annalan der Chemie, vol. 575, 1952, pages 162–173.